(12) United States Patent
Chen et al.

(10) Patent No.: US 11,553,596 B2
(45) Date of Patent: *Jan. 10, 2023

(54) EMBEDDED COMPONENT PACKAGE STRUCTURE AND MANUFACTURING METHOD THEREOF

(71) Applicant: Advanced Semiconductor Engineering, Inc., Kaohsiung (TW)

(72) Inventors: Chien-Fan Chen, Kaohsiung (TW); Chien-Hao Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 35 days.

This patent is subject to a terminal disclaimer.

(21) Appl. No.: 17/342,363

(22) Filed: Jun. 8, 2021

(65) Prior Publication Data

US 2021/0298176 A1  Sep. 23, 2021

Related U.S. Application Data

(63) Continuation of application No. 16/942,609, filed on Jul. 29, 2020, now Pat. No. 11,032,911, which is a
(Continued)

(51) Int. Cl.
| | |
|---|---|
| *H05K 7/00* | (2006.01) |
| *H05K 1/18* | (2006.01) |
| *H01L 21/48* | (2006.01) |
| *H01L 23/538* | (2006.01) |
| *H01L 21/56* | (2006.01) |

(52) U.S. Cl.
CPC ........... *H05K 1/183* (2013.01); *H01L 21/486* (2013.01); *H01L 21/4857* (2013.01); *H01L 21/568* (2013.01); *H01L 23/5383* (2013.01); *H01L 23/5386* (2013.01); *H01L 2224/04105* (2013.01); *H01L 2924/11* (2013.01);
(Continued)

(58) Field of Classification Search
CPC ... H05K 1/183; H01L 21/4857; H01L 21/486; H01L 21/568; H01L 23/5383; H01L 23/5386; H01L 2224/04105
USPC ........................................................ 361/760
See application file for complete search history.

(56) References Cited

U.S. PATENT DOCUMENTS

| | | |
|---|---|---|
| 9,406,658 B2 | 8/2016 | Lee et al. |
| 2006/0266792 A1 | 11/2006 | Ko et al. |

(Continued)

OTHER PUBLICATIONS

Non-Final Office Action for U.S. Appl. No. 16/942,609, dated Oct. 15, 2020, 14 pages.

(Continued)

*Primary Examiner* — Andargie M Aychillhum
(74) *Attorney, Agent, or Firm* — Foley & Lardner LLP

(57) ABSTRACT

A manufacturing method of an embedded component package structure includes the following steps: providing a carrier and forming a semi-cured first dielectric layer on the carrier, the semi-cured first dielectric layer having a first surface; providing a component on the semi-cured first dielectric layer, and respectively providing heat energies from a top and a bottom of the component to cure the semi-cured first dielectric layer; forming a second dielectric layer on the first dielectric layer to cover the component; and forming a patterned circuit layer on the second dielectric layer, the patterned circuit layer being electrically connected to the component.

17 Claims, 5 Drawing Sheets

Related U.S. Application Data continuation of application No. 16/159,264, filed on Oct. 12, 2018, now Pat. No. 10,757,813.

(52) U.S. Cl.
CPC .............. *H01L 2924/15153* (2013.01); *H05K 2201/10* (2013.01)

(56) References Cited

U.S. PATENT DOCUMENTS

| | | |
|---|---|---|
| 2012/0153493 A1 | 6/2012 | Lee et al. |
| 2016/0240569 A1 | 8/2016 | Kuo et al. |
| 2017/0186709 A1 | 6/2017 | Hsu et al. |
| 2019/0371731 A1 | 12/2019 | Kang et al. |

OTHER PUBLICATIONS

Non-Final Office Action for U.S. Appl. No. 16/159,264, dated Jan. 15, 2020, 12 pages.
Non-Final Office Action for U.S. Appl. No. 16/159,264, dated Sep. 19, 2019, 12 pages.
Notice of Allowance for U.S. Appl. No. 16/159,264, dated Apr. 16, 2020, 9 pages.
Notice of Allowance for U.S. Appl. No. 16/942,609, dated Feb. 5, 2021, 11 pages.

EMBEDDED COMPONENT PACKAGE STRUCTURE AND MANUFACTURING METHOD THEREOF

CROSS-REFERENCE TO RELATED PATENT APPLICATIONS

This application is a continuation of U.S. patent application Ser. No. 16/942,609 filed Jul. 29, 2020, which is a continuation of U.S. patent application Ser. No. 16/159,264 filed Oct. 12, 2018, the contents of which are incorporated herein by reference in their entireties.

BACKGROUND

Field of the Invention

The invention relates in general to a component package structure and a manufacturing method thereof, and more particularly to an embedded component package structure and a manufacturing method thereof.

Description of the Related Art

In a system-level package structure, a semiconductor embedded in substrate technology that embeds a semiconductor chip into a package substrate has advantages of reduced noise interference upon a package product as well as reduced product size, and has thus become a focus of research and development of manufacturers in the field. To enhance the production yield rate, it is necessary to fix an embedded component in a package substrate to facilitate electrical connection of patterned conductive circuits and the embedded component in subsequent processing. Therefore, there is a need for a solution for enhancing the reliability of bonding and package processes for an embedded component such that the embedded component remains secured in a package substrate.

SUMMARY OF THE INVENTION

The invention is directed to an embedded component package structure and a manufacturing method thereof capable of enhancing the reliability of a package process.

According to an aspect of the present invention, a manufacturing method of an embedded component package structure is provided. The method includes the following steps: providing a carrier and forming a semi-cured first dielectric layer on the carrier, the semi-cured first dielectric layer having a first surface; providing a component on the semi-cured first dielectric layer, and respectively providing heat energies from a top and a bottom of the component to cure the semi-cured first dielectric layer; forming a second dielectric layer on the first dielectric layer to cover the component; and forming a patterned circuit layer on the second dielectric layer, the patterned circuit layer being electrically connected to the component.

According to an aspect of the present invention, an embedded component package structure is provided. The embedded component package structure includes a first dielectric layer having a first surface; a component disposed on the first surface of the first dielectric layer, wherein the first dielectric layer surrounds and covers a side of the component, and the first dielectric layer has a covering height greater than 3 μm relative to the first surface; a second dielectric layer disposed on the first dielectric layer and covering the component; and a patterned circuit layer disposed on the second dielectric layer, and the patterned circuit layer is electrically connected to the component.

According to an aspect of the present invention, an embedded component package structure is provided. The embedded component package structure includes a first dielectric layer having a first surface; a component disposed on the first surface of the first dielectric layer, wherein a bottom surface of the component is lower than the first surface; a second dielectric layer disposed on the first dielectric layer and covering the component; and a patterned circuit layer disposed on the second dielectric layer, and the patterned circuit layer is electrically connected to the component.

The above and other aspects of the invention will become better understood with regard to the following detailed description of the preferred but non-limiting embodiments. The following description is made with reference to the accompanying drawings.

DETAILED DESCRIPTION

Details are given in the non-limiting embodiments below. It should be noted that the embodiments are illustrative examples and are not to be construed as limitations to the claimed scope of the present invention. The same/similar denotations are used to represent the same/similar components in the description below.

Figure 1:
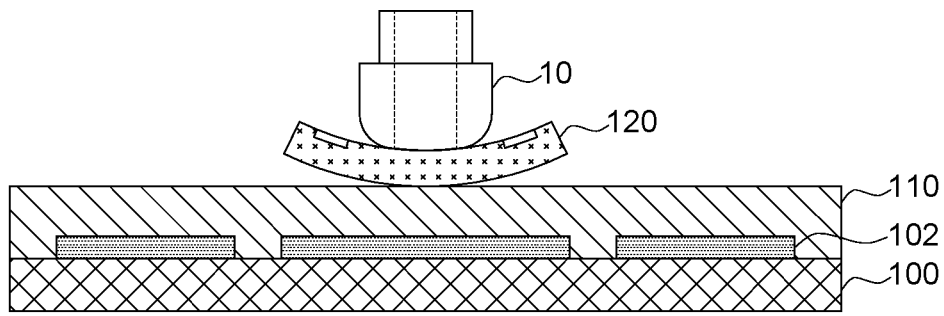
FIG. 1 and FIG. 2 are schematic diagrams of a manufacturing method of an embedded component package structure.
Figure 2:
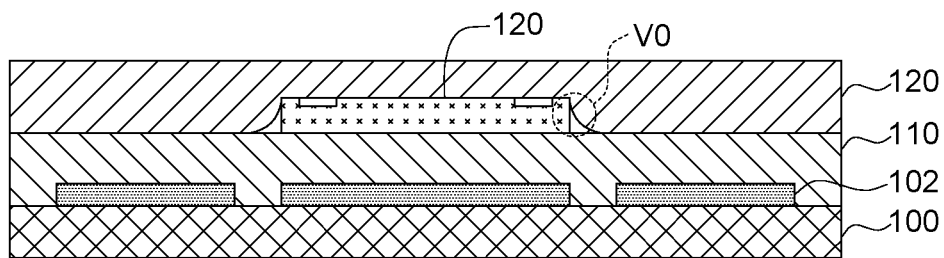

Referring to FIG. 1 and FIG. 2, before embedding a component 120 (taking a semiconductor chip for example) into a package structure, the component 120 is first placed on a first dielectric layer 110 of a carrier 100. The first dielectric layer 110 is, for example, a semi-cured prepreg. The carrier 100 is supported by a support platform (not shown) therebelow, and a heat energy is provided by a heating machine (not shown) to heat the first dielectric layer 110 to a predetermined temperature. The temperature provided by the heating machine is higher (approximately 80° C.), thus providing the preheated first dielectric layer 110 with predetermined glue crawling properties and fluidity, which are beneficial for bonding between the component 120 and the first dielectric layer 110 so as to fix the component 120 on the first dielectric layer 110. However, the curing speed of the first dielectric layer 110 with higher temperature will be faster accordingly. As shown in FIG. 2, when the first dielectric layer 110 is fully cured, a second dielectric layer 130 is formed on the first dielectric layer 110. The second dielectric layer 130 covers the top of the component 120.

In the above package process, when a sucking head 10 sucks the component 120, a warpage is incurred due to internal stress of the component 120 such that a bottom surface of the component 120 cannot be tightly bonded (not completely bonded) with the first dielectric layer 110, causing an insufficient adhesion force of the component 120. Further, in the subsequent curing process, the first dielectric layer 110 may cure at a high speed due to an excessively high temperature (e.g., 80° C. or higher). As a result, the first dielectric layer 110 may fail in effectively covering and surrounding surfaces (i.e., side surfaces) of the component 120, causing inadequate covering force of the first dielectric layer 110 upon the component 120 and hence susceptibility to falling off, in a way that subsequently lamination of the second dielectric layer 130 and a wire patterning process cannot be performed successfully.

Figure 3:
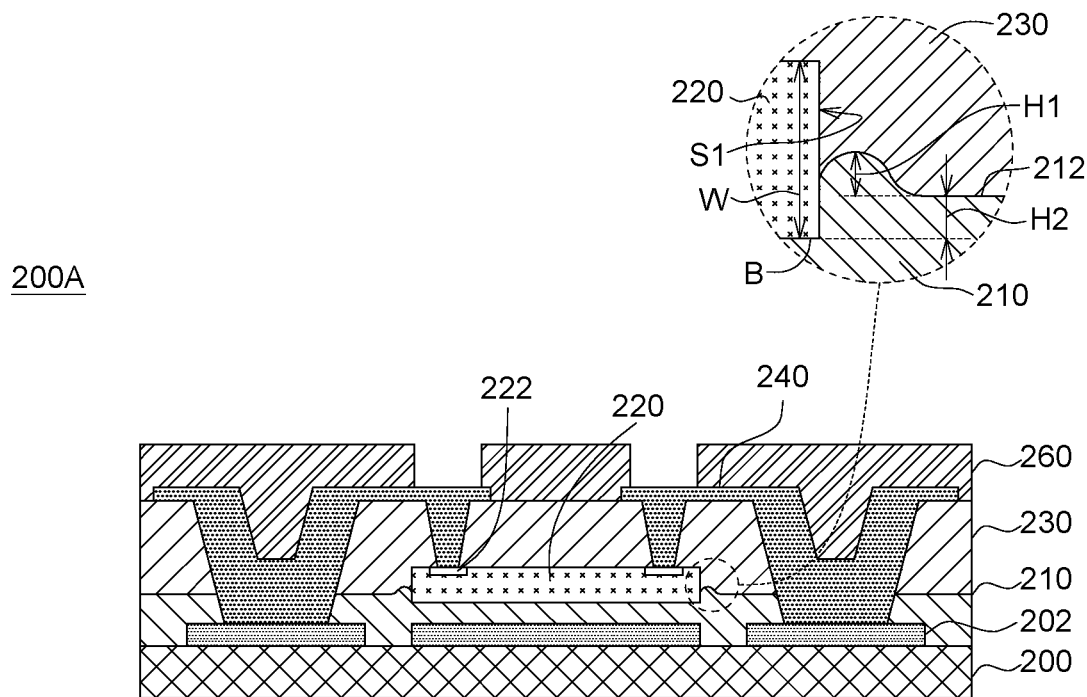
FIG. 3 is a schematic diagram of an embedded component package structure according to an embodiment of the present invention.

To solve the above issues, an embedded component package structure is provided. Referring to FIG. 3, the embedded component package structure 200A includes a circuit substrate 200, a first dielectric layer 210, a component 220, a second dielectric layer 230, a patterned circuit layer 240 and a patterned insulation protection layer 260. The circuit substrate 200 has a conductive wiring layer 202. The first dielectric layer 210 is disposed on the circuit substrate 200 and has a first surface 212. The component 220 is disposed on the first surface 212 of the first dielectric layer 210, and a bottom surface B of the component 220 is lower than the first surface 212, such that the component 220, such as a semiconductor chip, can be stably mounted on the first dielectric layer 210. The second dielectric layer 230 is disposed on the first dielectric layer 210 and covering the component 220. The patterned circuit layer 240 is disposed on the second dielectric layer 230, and the patterned circuit layer 240 is electrically connected to the component 220, patterned insulation protection layer 260.

In an embodiment, the first dielectric layer 210 surrounds and covers a side S1 of the component 220, and the first dielectric layer 210 has a covering height H1 greater than 3 pm relative to the first surface 212, such that the component 220, such as a semiconductor chip, can be stably mounted on the first dielectric layer 210. In an embodiment, a height difference H2 between the bottom surface B of the component 220 and the first surface 212 is preferably, for example, greater than 3 μm. In an embodiment, the covering height H of the first dielectric layer 210 is, for example, greater than or equal to 5 μm and smaller than the thickness W of the component 220.

To solve the above issues, a manufacturing method of an embedded component package structure 200A is provided by an embodiment. The method is capable of simultaneously providing heat energies from both the top and the bottom of the embedded component to cure the first dielectric layer. Further, a preheated sucking head used for suction and heating of the embedded component can improve the issue of warpage, allowing the embedded component to be more closely or even entirely bonded on the first dielectric layer, increasing the area and height of the embedded component covered by the first dielectric layer and hence keeping the embedded component securely fixed instead of being likely to falling off.

Referring to FIG. 4 to FIG. 9, a manufacturing method of the embedded component package structure 200B according to an embodiment of the present invention includes following steps. A carrier 200 is first provided, and a semi-cured first dielectric layer 210 is formed on the carrier 200, wherein the semi-cured first dielectric layer 210 has a first surface 212. A component 220 is provided on the semi-cured first dielectric layer 210, and heat energies Ha and Hb are at the same time provided respectively from the top and the bottom of the component 220 to cure the first dielectric layer 210. A second dielectric layer 230 is formed on the first dielectric layer 210 to cover the component 220. A patterned circuit layer 240 is formed on the second dielectric layer 230, and the patterned circuit layer 240 is electrically connected to the component 220. Details of the above steps are given with the accompanying drawings below.

Figure 4:
FIGS. 4, 5. 6A to 6C, 7 and FIG. 8 are schematic diagrams of a manufacturing method of an embedded component package structure according to an embodiment of the present invention.

Referring to FIG. 4, the carrier 200 is, for example, a circuit substrate, which has a conductive wiring layer 202. The circuit substrate may be, for example, a copper clad laminate (CCL), a metal core PCB (MCPCB) or a ceramic substrate. In another embodiment, the carrier 200 is, for example, a glass substrate, and serves as a substrate for temporary support and does not include any conductive wires.

Figure 5:
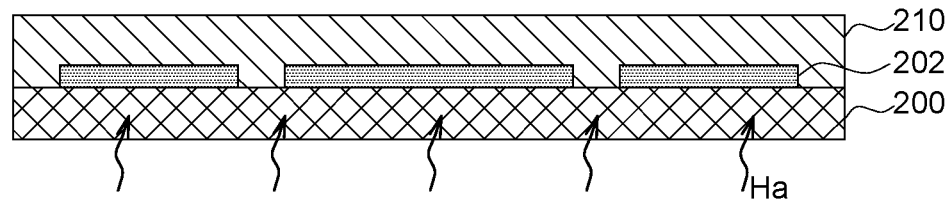

Referring to FIG. 5, the semi-cured first dielectric layer 210 is formed on the carrier 200, and the stable heat energy Ha is provided at the same time by a heating machine (not shown) at the bottom of the carrier 200 so as to keep the first dielectric layer 210 at a predetermined temperature. In this embodiment, the temperature of the heat energy Ha, for example, drops from 80° C. to 50° C., thus preventing an overly high curing speed of the dielectric layer 210 and hence from failure in effectively covering a side surface of the component. On the other hand, after having lowered the temperature of the heat energy Ha, the glue crawling properties and the fluidity of the semi-cured first dielectric layer 210 can be kept within a certain range for facilitating a subsequent bonding process. In general, the material of the first dielectric layer 210 may be a resin material without glass fiber, e.g., one selected from a group consisting of liquid crystal polymer, bismaleimide triazine (BT) resin, a semi-cured prepreg, an ajinomoto build-up (ABF) film, epoxy and polyimide; the present invention is not limited to the above examples.

Figure 6A:
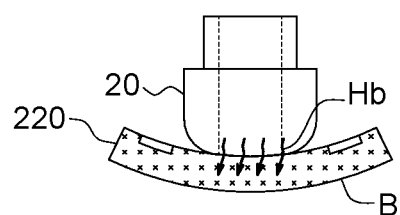
Figure 6B:
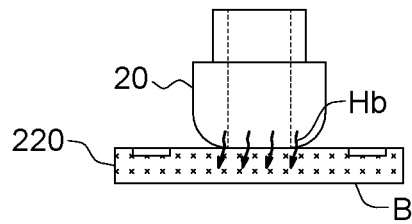

Referring to FIG. 6A and FIG. 6B, the component 220 is sucked by the preheated sucking head 20, and another heat energy Hb is provided by the sucking head 20 to the top of the component 220. The temperature of the heat energy Hb is between 100° C. and 150° C., e.g., 130° C., which is higher than the temperature of the heat energy Ha transmitted from the bottom of the carrier 200 to the first dielectric layer 210. As shown in FIG. 6B, after the component 220 absorbs the heat energy Hb transmitted from the preheated sucking head 20, the warpage generated by the internal stress of the component 220 can be mitigated to maintain the bottom surface B of the component 220 as a planar surface, so as to facilitate subsequently bonding the component 220 on the first dielectric layer 210.

Figure 6C:
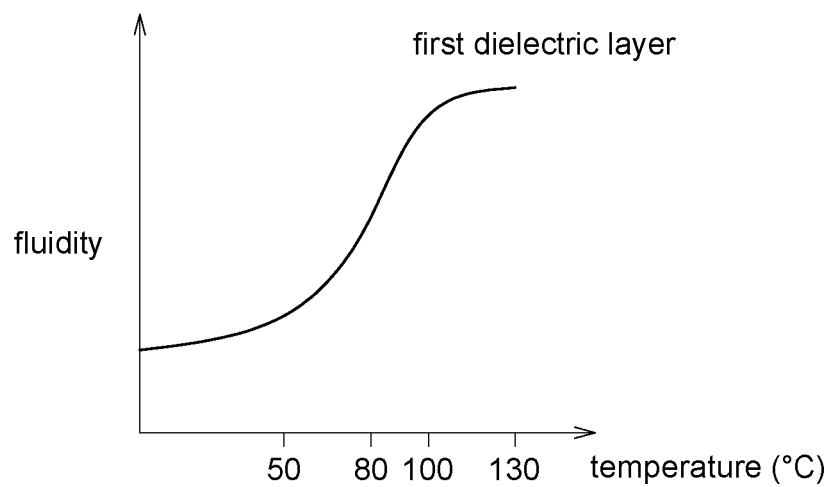
Figure 7:
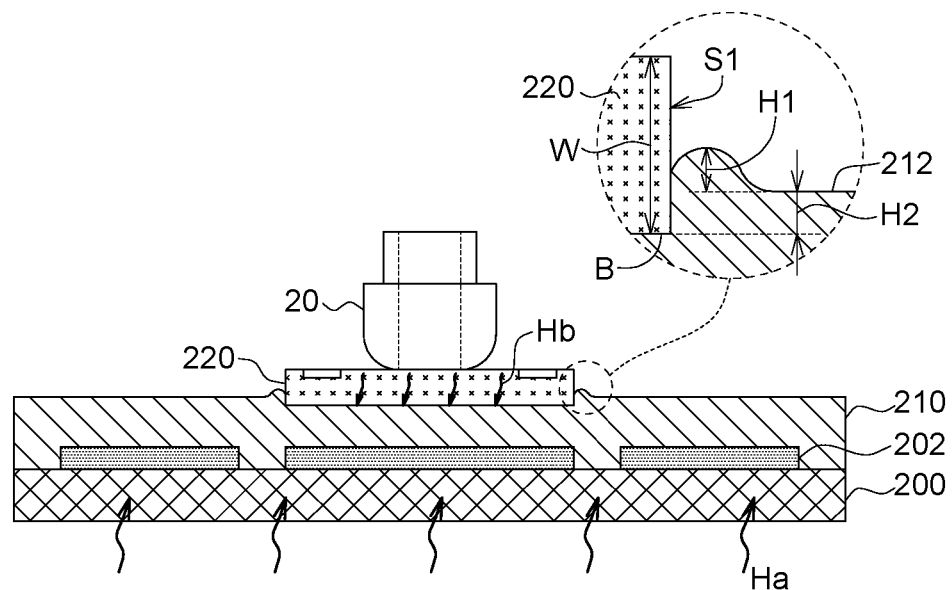

Referring to FIG. 7, the component 220 is substantially free from warpage (i.e., planarized) after having absorbed the heat energy Hb, and the bottom surface B of the component 220 can be pressed downwards by the sucking head 20 and becomes directly and flatly placed on the first dielectric layer 210. Further, the component 220 can directly transmit the heat energy Hb to the first surface 212, such that the first dielectric layer 210 below the component 220 absorbs the heat energy Hb and melts, further increasing the fluidity of the first dielectric layer 210, which is beneficial for the first dielectric layer 220 to cover and surround a side S1 of the component 220. Referring to FIG. 6C and FIG. 7, after the first dielectric layer 210 below the component 220 absorbs the heat energy Hb, the temperature of the first dielectric layer 210 around the component 220 can rise from a predetermined temperature (e.g., 50° C.) to about 130° C., thus increasing the glue crawling properties and the fluidity of the first dielectric layer 210 as shown in FIG. 6C. When the heated component 220 comes into contact with the first dielectric layer 210, conditions of glue crawling and adhesion of the first dielectric layer 210 are better than those when the first dielectric layer 110 comes into contact with the non-heated component 120. As a result, the covering height of the first dielectric layer 210 is relatively increased.

As shown in FIG. 7, in an embodiment, the covering height H1 of the first dielectric layer 210 on the side surface S1 of the component 220 relative to the first surface 212 is greater than, for example, 3 μm, or even greater than or equal to 5 μm. Thus, the component 220 can be securely fixed on the first dielectric layer 210. In an embodiment, the covering height H of the first dielectric layer 210 is, for example, smaller than the thickness W of the component 220; the present invention is not limited to the above examples.

Referring to FIG. 3 and FIG. 7, in the package process in FIGS. 1 and 2, the first dielectric layer 110 is heated by single-side heating, and undesired warpage of the component 120 is produced in non-heated situation, such that the first dielectric layer 110 cannot effectively cover the side of the component 120. Further, when the second dielectric layer 130 covers the first dielectric layer 110, a void VO is likely formed at the periphery of the component 120 (an area near the bottom of the side surface that is not covered by the first dielectric layer 110), and the second dielectric layer 130 cannot entirely fill this void VO. Thus, the component 120 can rely only on the bottom surface thereof to contact the first dielectric layer 110, rendering poor reliability of the component 120 after the package process. Conversely, in the package process in FIG. 7, the first dielectric layer 210 is heated by dual-side heating, i.e., the heat energy Hb of a predetermined temperature (e.g., 130° C.) is further provided to the top of the first dielectric layer 210 to assist partially heating and melting the first dielectric layer 210. In addition, the heat energy Hb is provided to the top of the component 220 for preheating such that the warpage of the component 220 is unlikely incurred. Thus, the first dielectric layer 210 is capable of effectively covering the side S1 of the component 220, and controlling the covering height H1 to be greater than a predetermined value. Therefore, the side surface S1 of the component 220 can be tightly covered by the first dielectric layer 210 having better glue crawling conditions or adhesion conditions, further enhancing the reliability of the component 220 after the package process. Moreover, when the component 220 is fixed at the first dielectric layer 210, it can be placed in an oven and be heated by a predetermined temperature (e.g., 180° C.) for a predetermined period (e.g., more than 30 minutes) to fully cure the first dielectric layer 210.

Further, when the component 220 is preheated by the sucking head 20 and placed on the first dielectric layer 210, the bottom surface B of the component 220 can be preferably aligned with the first surface 212 or be sunk to be lower than the first surface 212 due to the increased fluidity of the melted first dielectric layer 210. In an embodiment, a height difference H2 between the bottom surface B of the component 220 and the first surface 212 is preferably, for example, greater than 3 μm. As such, in the manufacturing method of the present invention, a recess or an opening reserved for accommodating the component 220 need not be manufactured on the first surface 212, thus eliminating an opening process, and additional adhesive for fixing the component 220 is not required at the bottom surface B of the component 220. In contrast, the dielectric material (i.e., the first dielectric layer 210) of the carrier 200 is directly bonded with the bottom surface B of the component 220, such that the reliability of the component 220 after the package process is relatively enhanced, and the position of the component 220 is accurately aligned to reduce any alignment error.

Figure 8:
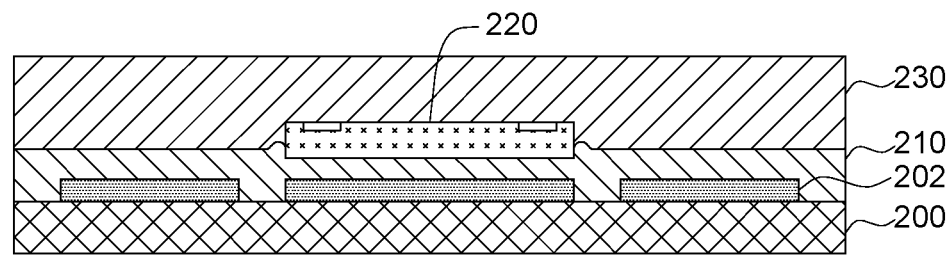

Referring to FIG. 8, the second dielectric layer 230 is formed on the first dielectric layer 210 and covers the component 220. More specifically, the second dielectric layer 230 can completely cover the first dielectric layer 210 and surround the sides of the component 220. When the second dielectric layer 230 is fully cured, the component 220 is embedded between the first dielectric layer 210 and the second dielectric layer 230 to form an embedded component package structure. The embedded component 220 may be at least one of an active device (e.g., a transistor, an integrated circuit chip, a logic circuit device or a power amplifier) and a passive device (e.g., a capacitor, an inductor or a resistor). The number of the embedded component is not limited to one, the first dielectric layer 210 and the second dielectric layer 230 may be single-layer or multi-layer structures, and the first dielectric layer 210 and the second dielectric layer 230 may be insulation materials made of the same material or different materials; the present invention is not limited to the above examples.

Figure 9:
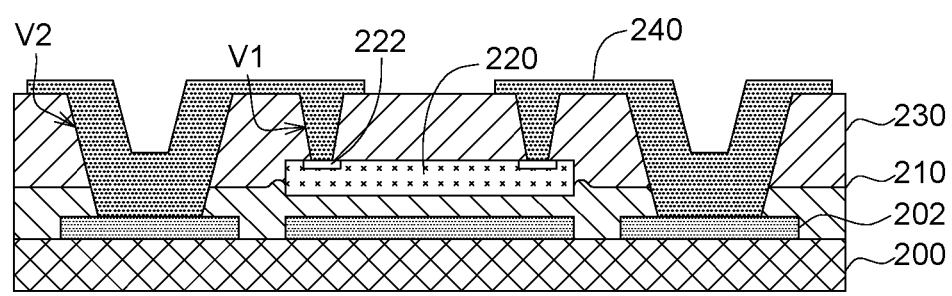
FIG. 9 is a schematic diagram of forming a patterned circuit layer on a carrier.

Referring to FIG. 9, a patterned circuit layer 240 is formed on the second dielectric layer 230, and the patterned circuit layer 240 may be electrically connected to the component 220. In an embodiment, the component 220 includes at least one pad 222 located in a via hole V1, and the patterned circuit layer 240 extends from the pad 222 of the component 220 into the via hole V1 and onto the second dielectric layer 230. Details of a manufacturing method of the patterned via hole V1 are given below. Firstly, after forming the second dielectric layer 230, a via hole V1 passing through the second dielectric layer 230 is formed by means of wet etching or dry etching to expose at least one pad 222 of the component 222. Next, a patterned circuit layer 240 is formed on the second dielectric layer 230, and the patterned circuit layer 240 is electrically connected to the component 220 through the pad 222 in the via hole V1. In an embodiment, the patterned circuit layer 240 may be electrically connected to the conductive wiring layer 202 through another via hole V2 passing through the first dielectric layer 210 and the second dielectric layer 230, so as to form an embedded component package structure 200A. The patterned circuit layer 240 may be a copper layer or an aluminum layer. A patterned insulation protection layer 260 (as shown in FIG. 10B and FIG. 3), e.g., made of green paint or other insulation materials, may be formed to cover the top of the patterned circuit layer 240.

Figure 10A:
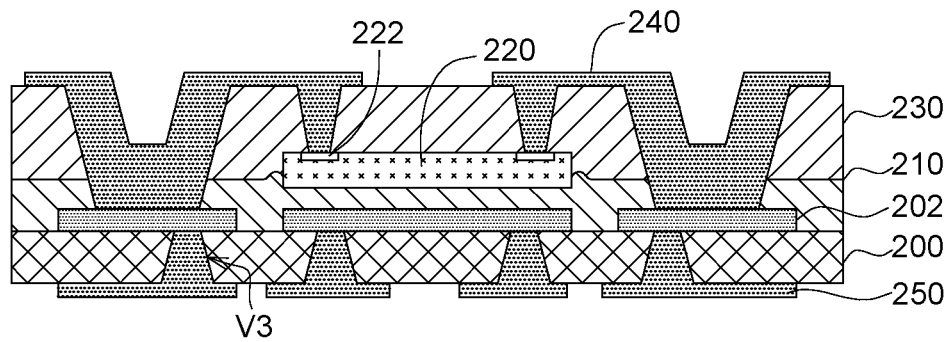
FIG. 10A and FIG. 10B are schematic diagrams of forming another patterned circuit layer on a carrier.
Figure 10B:
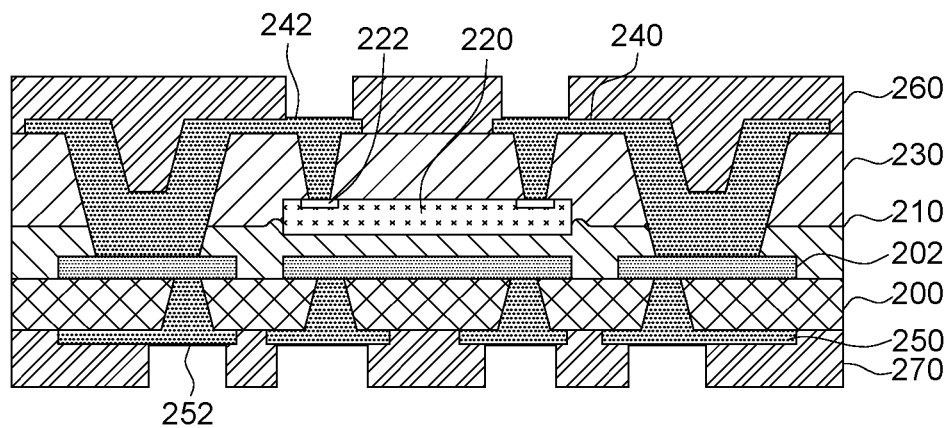

Referring to FIG. 10A and FIG. 10B, after completing the above patterned circuit layer 240, another patterned circuit layer 250 may be formed on the carrier 200, so as to manufacture an embedded component package structure 200C having dual-side (top and bottom) conductive circuits. A manufacturing method of a patterned via hole V3 is similar to that of the via hole V1, and differs only in that, the via hole V3 passes through the carrier 20 to expose the conductive wiring layer 202 of the carrier 200. Next, the patterned circuit layer 250 is formed on the other surface (i.e., the bottom surface) of the carrier 200, and the patterned circuit layer 250 at the bottom is electrically connected to the conductive wiring layer 202 through the via hole V3. Further, in another embodiment, the patterned circuit layer 250 at the bottom may be electrically connected to the patterned circuit layer 240 on the top through an interlayer conductive via or directly through a vertically conducted through hole (not shown); the present invention is not limited to the above examples.

Referring to FIG. 10B, the patterned insulation protection layers 260 and 270 are respectively formed on the patterned circuit layers 240 and 250 at the top and the bottom, and electrical contacts 242 and 252 at the top and the bottom are exposed. The pad 222 of the component 220 may be electrically connected to the electrical contacts 242 and 252 at the top and the bottom through these two patterned circuit layers 240 and 250. The electrical contacts 242 and 252 are, for example, solder protrusions, lead-less protrusions, copper protrusions or gold protrusions provided for electrically connecting to external electronic signals; the present invention is not limited to the above examples.

Figure 11:
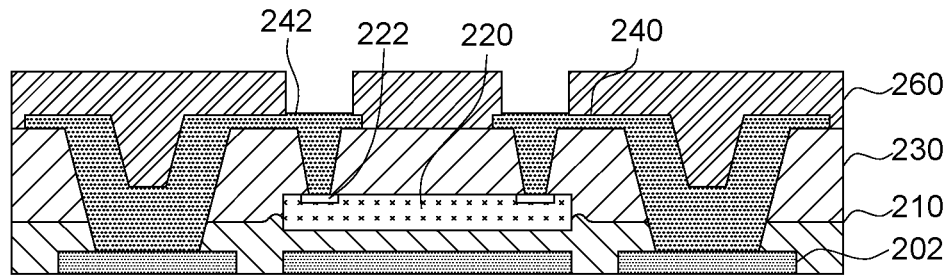
FIG. 11 is a schematic diagram of an embedded component package structure according to another embodiment of the present invention.

Referring to FIG. 9 and FIG. 11, in an embodiment, the carrier 200 in FIG. 9 serves only as a substrate for providing temporary support, and the carrier 200 may be removed or separated to expose the conductive wiring layer 202 of the embedded component package structure 200D, as shown in FIG. 11. In FIG. 11, the conductive wiring layer 202 is not limited to being a single-layer structure, and may also be a multi-layer structure. Further, the patterned insulation protection layer 270 and the electrical contact 252 may be formed at the bottom of the conductive wiring layer 202, as shown in FIG. 10B, the present invention is not limited to the above examples.

In the embedded component package structure disclosed by the embodiments of the present invention, the first dielectric layer 210 and the second dielectric layer 230 that are laminated and stacked are given as an example. However, the embedded component may also be provided in multiple laminated and stacked dielectric layers instead of being provided in two layers. Further, the embedded component 220 is not limited to being located in the laminated and stacked first dielectric layer 210 and second dielectric layer 230, and more than one embedded component 220 may also be provided between any two adjacently arranged dielectric layers according to package requirements.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An embedded component package structure, comprising: a component having a first surface, a second surface opposite to the first surface, and a lateral surface extending between the first surface and the second surface; and an encapsulation layer covering the lateral surface of the component and having a third surface, wherein the third surface of the encapsulation layer is between the first surface of the component and the second surface of the component, wherein the encapsulation layer comprises a curved surface extending between the lateral surface of the component and the third surface of the encapsulation layer.

2. The embedded component package structure according to claim 1, wherein the encapsulation layer covers the lateral surface of the component and the first surface of the component and a point of curvature of the curved surface is closer to the second surface of the component than to the first surface of the component.

3. The embedded component package structure according to claim 1, wherein the encapsulation layer comprises a portion extending from the third surface of the encapsulation layer in a direction away from the second surface of the component.

4. The embedded component package structure according to claim 3, wherein the portion contacts the lateral surface of the component and the third surface of the encapsulation layer.

5. The embedded component package structure according to claim 1, wherein the encapsulation layer covers the lateral surface of the component and the first surface of the component, and wherein the second surface of the component is exposed from the third surface of the encapsulation layer.

6. A a component having a first surface, a second surface opposite to the first surface, and a lateral surface extending between the first surface and the second surface; and a first encapsulation layer covering a first region of the lateral surface of the component and exposing a second region of the lateral surface of the component, wherein the first encapsulation layer comprises a third surface, and the second region of the lateral surface of the component comprises a first sub-region and a second sub-region divided by an extension of the third surface of the first encapsulation layer.

7. The embedded component package structure according to claim 6, wherein the second sub-region is between the second surface of the component and the third surface of the encapsulation layer.

8. The embedded component package structure according to claim 6, further comprising a second encapsulation layer covering the second region of the lateral surface of the component.

9. The embedded component package structure according to claim 8, wherein the first encapsulation layer is engaged with the second encapsulation layer.

10. The embedded component package structure according to claim 6, further comprising a first conductive structure disposed on the first surface of the component and surrounded by the first encapsulation layer.

11. The embedded component package structure according to claim 10, wherein the first conductive structure comprises a conductive via electrically connected with the component.

12. The embedded component package structure according to claim 11, wherein the first encapsulation layer covers a sidewall of the conductive via.

13. The embedded component package structure according to claim 10, further comprising a second conductive structure adjacent to the lateral surface of the component, wherein the first conductive structure is electrically connected with the component and the second conductive structure.

14. The embedded component package structure according to claim 13, wherein the second conductive structure comprises an end exposed from the first encapsulation layer.

15. A manufacturing method of an embedded component package structure, comprising: providing a supporting layer having a first surface and a second surface opposite to the first surface of the supporting layer; and placing a component on the first surface of the supporting layer such that the first surface of the supporting layer recesses toward the second surface of the supporting layer, wherein the component comprises a third surface adjacent to the first surface of the supporting layer, and wherein the component is placed on the first surface of the supporting layer such that the third surface of the component is at least partially between the first surface of the supporting layer and the second surface of the supporting layer.

16. The manufacturing method according to claim 15, wherein the component comprises a fourth surface opposite to the third surface of the component and a lateral surface extending between the third surface of the component and the fourth surface of the component, and wherein the component is placed on the first surface of the supporting layer such that the lateral surface of the component is at least partially covered by the supporting layer.

17. The manufacturing method according to claim 15, further comprising forming a encapsulation layer to cover the component and the supporting layer.

\* \* \* \* \*